United States Patent
Kim et al.

(10) Patent No.: US 8,344,367 B2
(45) Date of Patent: Jan. 1, 2013

(54) MOLECULAR DEVICES AND METHODS OF MANUFACTURING THE SAME

(75) Inventors: Dong-Won Kim, Seongnam-si (KR); Dong-Gun Park, Seongnam-si (KR); Sung-Young Lee, Yongin-si (KR); Yang-Kyu Choi, Daejeon (KR); Lee-Eun Yu, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/929,118

(22) Filed: Jan. 3, 2011

(65) Prior Publication Data
US 2011/0108795 A1     May 12, 2011

Related U.S. Application Data

(62) Division of application No. 12/068,765, filed on Feb. 12, 2008, now Pat. No. 7,883,932.

(30) Foreign Application Priority Data

Feb. 12, 2007 (KR) .................. 10-2007-0014545

(51) Int. Cl.
*H01L 29/08* (2006.01)
(52) U.S. Cl. .................. 257/40; 257/9; 257/E29.168
(58) Field of Classification Search ............ 257/9, 40, 257/E29.168
See application file for complete search history.

(56) References Cited

U.S. PATENT DOCUMENTS

| | | | |
|---|---|---|---|
| 7,615,779 B2 * | 11/2009 | Zhitenev | 257/40 |
| 7,718,549 B2 | 5/2010 | Chua et al. | |
| 7,803,669 B2 | 9/2010 | Cho et al. | |
| 2005/0051768 A1 * | 3/2005 | Kim et al. | 257/40 |
| 2006/0113536 A1 * | 6/2006 | Kumomi et al. | 257/57 |

FOREIGN PATENT DOCUMENTS

| | | |
|---|---|---|
| KR | 2003-0089936 | 11/2003 |
| KR | 2003-0097323 | 12/2003 |
| KR | 0450757 | 9/2004 |
| KR | 0470831 | 1/2005 |
| KR | 1020050019969 | 3/2005 |
| KR | 1020050025386 | 3/2005 |
| KR | 0549227 | 1/2006 |
| KR | 1020060081858 | 7/2006 |

OTHER PUBLICATIONS

Korean Office Action issued Dec. 17, 2007.

* cited by examiner

*Primary Examiner* — Cuong Q Nguyen
*Assistant Examiner* — Tran Tran
(74) *Attorney, Agent, or Firm* — Harness, Dickey & Pierce, P.L.C.

(57) ABSTRACT

Molecular devices and methods of manufacturing the molecular device are provided. The molecular device may include a lower electrode on a substrate and a self-assembled monolayer on the lower electrode. After an upper electrode is formed on the self-assembled monolayer, the self-assembled monolayer may be removed to form a gap between the lower electrode and the upper electrode. A functional molecule having a functional group may be injected into the gap.

10 Claims, 10 Drawing Sheets

MOLECULAR DEVICES AND METHODS OF MANUFACTURING THE SAME

PRIORITY STATEMENT

This application is a divisional application of U.S. application Ser. No. 12/068,765, filed on Feb. 12, 2008 now U.S. Pat. No. 7,883,932, which claims the benefit of priority under 35 USC §119 to Korean Patent Application No. 2007-14545 filed on Feb. 12, 2007, the contents of each of which are herein incorporated by reference in their entirety.

BACKGROUND

1. Field

Example embodiments relate to molecular devices and methods of manufacturing the molecular devices. Other example embodiments relate to molecular devices utilizing electric characteristics of functional molecules having functional groups, and methods of manufacturing the molecular devices.

2. Description of the Related Art

Technology for integrating semiconductor devices, which is based on Moore's Law, is continually being developed. However, there is a limit to the degree in which a semiconductor device (e.g., a transistor) can be integrated due to increased leakage current and/or heat loss that occurs as a result of an enlarged resistance of the semiconductor device. An increase in the leakage current and/or heat loss deteriorate the reliability of the semiconductor device.

Various solutions have been researched with regard to the development of a technology suitable for replacing conventional silicon technology. In large due to the recent development of nanotechnology, molecules having nano-sizes are used in an electronic device by a bottom-up method instead of a conventional top-down method in order to manufacture a molecule device, one of the smallest devices manufactured. A molecular device may have a higher integration degree, a higher response speed and/or be manufactured at a lower cost. A molecular device may be manufactured using molecular electronic technology.

Nanotechnology was developed in order to facilitate the manufacture of molecular devices in accordance with molecular electronic technology. The size of which a nano-electrode may be manufactured using current nanotechnology is limited to about 5 nanometers (nm), despite the use of an electron-beam lithography process. Because the size of a small molecule is about one nanometer, it is difficult to form a molecular junction between adjacent small molecules. The formation of a stable junction between the molecule and the electrode increases reproducibility of the process used to manufacture the molecular device. Recent research has been focused on methods to form a connection between adjacent electrodes separated by a distance substantially larger than the size of the molecule.

Conventional electrodes have problems such as an irregular spatial interval between adjacent electrodes and instability of a junction between the electrode and the molecules. It may be difficult to determine the number of molecules simultaneously connected to the electrodes.

Hereinafter, a conventional molecular device will be described with reference to the accompanying drawings.

Figure 1A:
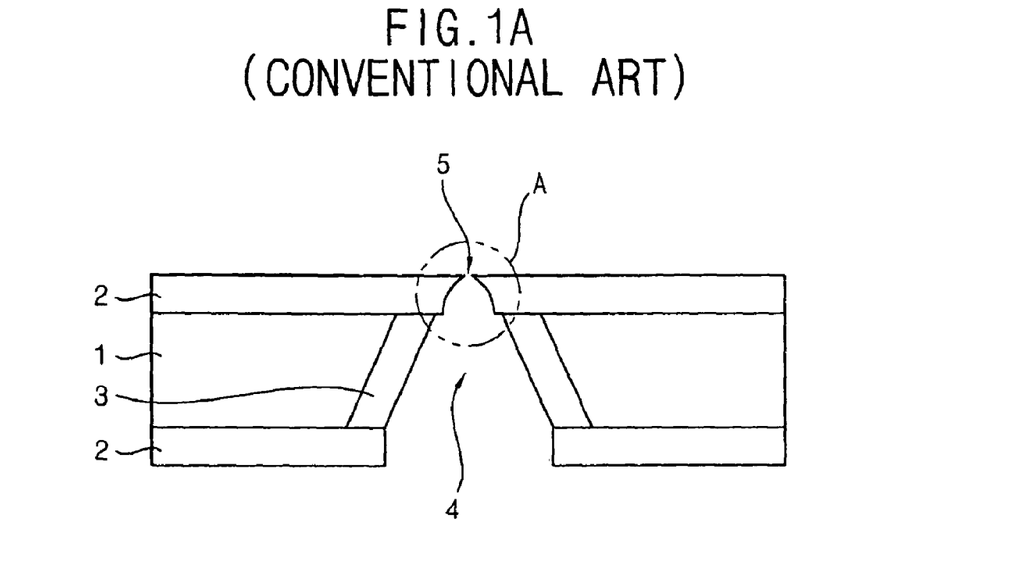
FIG. 1A is a diagram illustrating cross-sectional view of a conventional molecular device.
Figure 1B:
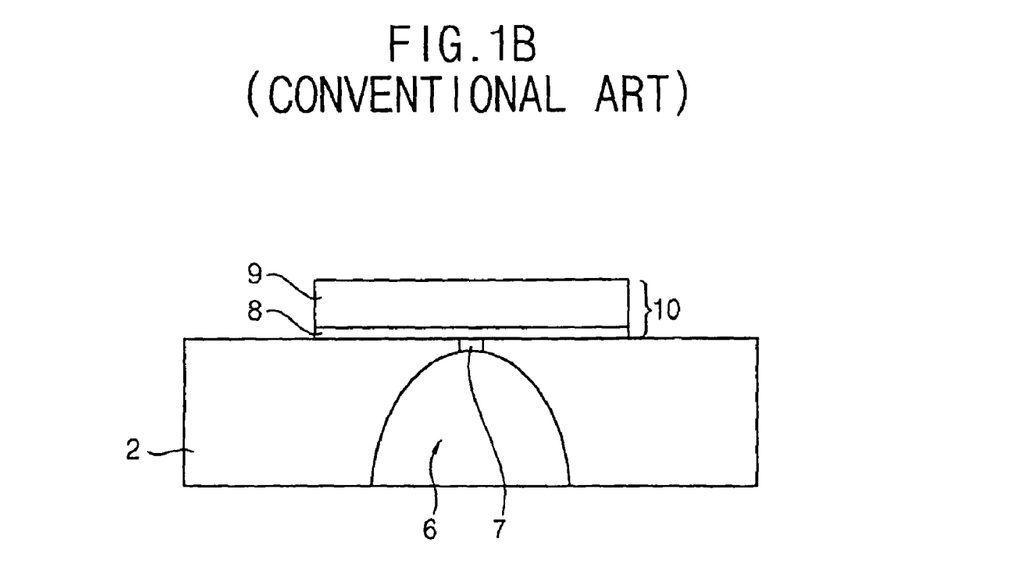
FIG. 1B is a diagram illustrating an enlarged cross-sectional view of portion "A" in FIG. 1A.

FIG. 1A is a diagram illustrating a cross-sectional view of a conventional molecular device. FIG. 1B is diagram illustrating an enlarged cross-sectional view of portion "A" in FIG. 1A.

Referring to FIGS. 1A and 1B, nitride membranes 2 may be formed at both sides of a silicon substrate 1. One of the two nitride membranes 2 may be etched to form a hole 4 through the silicon substrate 1. A nano-hole 5 may be formed through the other of the two nitride membrane 2 by a reactive ion etching (RIE) process. Gold (Au) may be deposited in the hole 4 and the nano-hole 5 to form a lower electrode 6 in the hole 4 and the nano-hole 5.

A self-assembled monolayer 7 may be formed on the lower electrode 6. An upper electrode 10 may be formed on the self-assembled monolayer 7 and the nitride membrane 2. The upper electrode 10 may include a titanium (Ti) film 8 and a gold (Au) film 9. The titanium film 8 and the gold film 9 may be successively formed on the self-assembled monolayer 7 and the nitride membrane 2.

The above-described processes for manufacturing the conventional molecular device may be complicated. The molecular device may not have a desired integration degree due to taper etching processes used to form the hole 4 and the nano-hole 5. Yield and/or reliability of the conventional molecular device may be deteriorated. The self-assembled monolayer 7 of the conventional molecular device may be damaged while forming the upper electrode 10 on the self-assembled monolayer 7.

SUMMARY

Example embodiments provide molecular devices and methods of manufacturing the molecular devices. Other example embodiments provide molecular devices utilizing electric characteristics of functional molecules having functional groups and methods of manufacturing the molecular devices.

Example embodiments provide a molecular device having increased electrical characteristics by reducing (or preventing) damage to a molecular layer thereof.

Example embodiments provide a method of manufacturing a molecular device with a higher reproducibility using easier processes.

According to example embodiments, there is provided a molecular device including a lower electrode, an upper electrode and a functional molecule having a functional group. The lower and the upper electrodes may be formed on a substrate. The upper electrode may overlap with the lower electrode by interposing a gap between the lower electrode and the upper electrode. The functional molecule having the functional group may be interposed in the gap.

The lower electrode may extend along a first direction and the upper electrode may extend in a second direction substantially perpendicular to the first direction. The lower electrode may be formed using one selected from the group consisting of gold (Au), silver (Ag), platinum (Pt), alloys thereof and combinations thereof.

The gap may be formed by removing a self-assembled monolayer positioned between the lower electrode and the upper electrode. A width of the gap may be substantially the same as a size of the functional molecule. The functional molecule interposed in the gap may have a monolayer structure.

The substrate may include a transparent and/or flexible plastic.

A spacer may be formed between the upper electrode and a side of the lower electrode. The gap may be formed by removing a self-assembled monolayer selectively formed between the upper electrode and an upper surface of the lower electrode. An insulation layer may be formed on an upper surface of the upper electrode and the upper surface of the lower electrode. A thickness of the insulation layer may be substantially smaller than a width of the gap. The insulation layer may be positioned along an outer surface of the gap.

According to example embodiments, there is provided a method of manufacturing a molecular device. In the method of manufacturing the molecular device, a lower electrode may be formed on a substrate. A self-assembled monolayer may be formed on the lower electrode. An upper electrode may be formed on the self-assembled monolayer. The self-assembled monolayer may be removed to form a gap between the lower electrode and the upper electrode. A functional molecule having a functional group may be injected into the gap.

In example embodiments, the functional molecule may be injected by a capillary force.

In example embodiments, a contact angle of a solution, in which the functional molecule is dissolved, may be adjusted with respect to the substrate while injecting the functional molecule into the gap.

When the functional molecule is injected into the gap, an area inside of the gap and/or a surface of the functional molecule may be reformed, causing (or creating) a mutual bonding force. The functional molecule may be injected into the gap by the mutual bonding force. The area inside of the gap and/or the surface of the functional molecule may be reformed by attaching (or bonding) the functional molecule and the functional group to the area inside of the gap.

In example embodiments, a spacer may be formed on a side surface of the lower electrode before forming the self-assembled monolayer on the lower electrode. The insulation layer may be formed on upper surfaces of the lower and upper electrodes before injecting the functional molecule into the gap. The insulation layer may be formed along an area outside surface of the gap. A thickness of the insulation layer may be substantially smaller than the width of the gap.

According to example embodiments, the width of a gap where a functional molecule is interposed may be determined by a thickness of a self-assembled monolayer. The width of the gap may be accurately adjusted by controlling the thickness of the self-assembled monolayer formed prior to the gap. A plurality of gaps having uniform widths may be simultaneously provided by removing the self-assembled monolayer. The number of functional molecules may be controlled by adjusting the width of the gap. The molecular device may include cells each having single functional molecules by adjusting the width of each gap. As such, uniformity of the molecular device may be established although the molecular device includes a plurality of cells.

A molecular layer may be formed after the upper electrode such that a deterioration (or loss) of the molecular layer decreases. An additional etching process for separating cells from each other may not be necessary. A cross-talk phenomenon, which is caused by a connection between molecules in cells when a molecular layer is formed by a self-assembled method or a Langmuir-Blodgett method, is less likely to occur.

According to example embodiments, a plastic substrate may impart flexibility to a molecular device such that the molecular device may be used in a variety of electronic devices (e.g., a smart card, a high frequency reader device, etc.).

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to molecular devices and methods of manufacturing the molecular devices. Other example embodiments relate to molecular devices utilizing electric characteristics of functional molecules having functional groups and methods of manufacturing the molecular devices.

Figure 2:
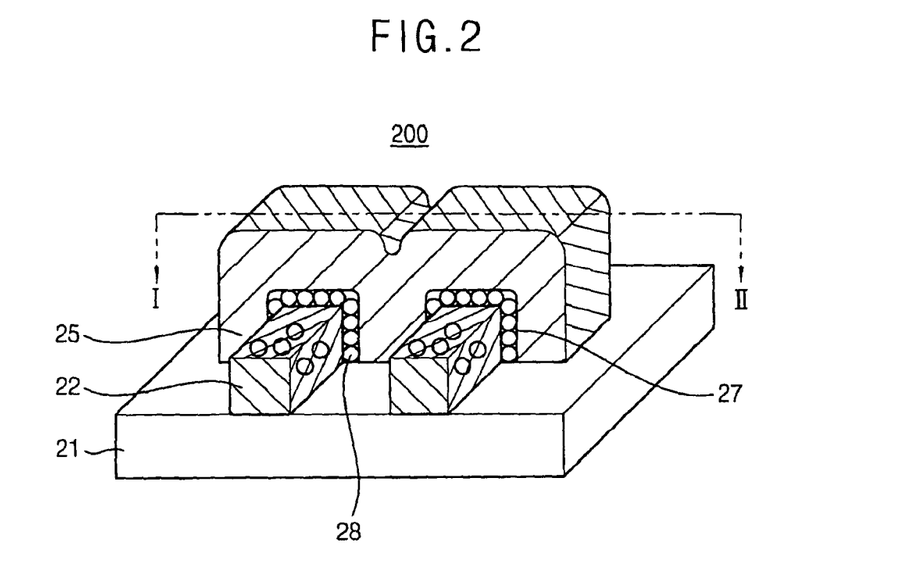
FIG. 2 is a diagram illustrating a perspective view of a molecular device 200 in accordance with example embodiments.
Figure 3:
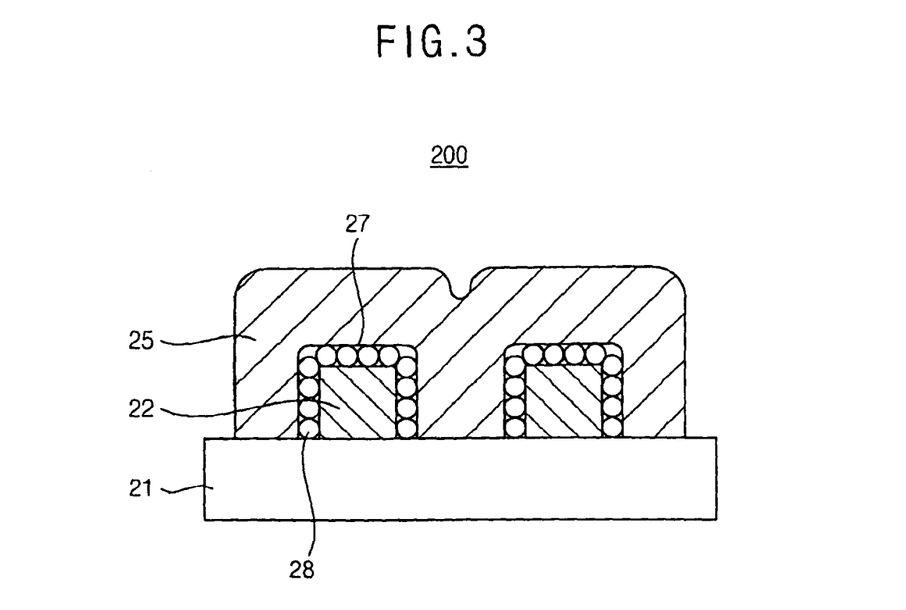
FIG. 3 is a diagram illustrating a cross-sectional view of molecular device 200 taken along line I-II in FIG. 2.

FIG. 2 is a diagram illustrating a perspective view of a molecular device 200 in accordance with example embodiments. FIG. 3 is a diagram illustrating a cross-sectional view of molecular device 200 taken along line I-II in FIG. 2.

Referring to FIGS. 2 and 3, the molecular device 200 includes a substrate 21, a lower electrode 22, an upper electrode 25 and functional molecules 28 having predetermined functional groups.

The substrate 21 may be formed of a transparent flexible plastic (e.g., polyethylene terephthalate (PET)). PET is inexpensive. As such, forming the substrate 21 of PET may decrease a manufacturing cost of the molecular device 200.

The lower electrode 22 and the upper electrode 25 may be provided on the substrate 21. Each of the lower electrode 22 and the upper electrode 25 may include a conductive material (e.g., a metal, a metal compound, doped polysilicon or the like). The lower electrode 22 and the upper electrode 25 may be at least one selected from the group consisting of gold (Au), tungsten (W), titanium (Ti), titanium nitride ($TiN_x$), tantalum (Ta), tantalum nitride ($TaN_x$), molybdenum nitride ($MoN_x$), niobium nitride ($NbN_x$), titanium silicon nitride ($TaSiN_x$), aluminum (Al), titanium aluminum nitride ($TiAlN_x$), titanium boron nitride ($TiBN_x$), zirconium silicon nitride ($ZrSiN_x$), tungsten silicon nitride ($WSiN_x$), tungsten boron nitride ($WBN_x$), zirconium aluminum nitride ($ZrAlN_x$), molybdenum silicon nitride ($MoSiN_x$), molybdenum aluminum nitride ($MoAlN_x$), tantalum silicon nitride ($TaSiN_x$), copper (Cu), aluminum-copper (Al—Cu), alloys thereof and combinations thereof.

The lower electrode 22 and the upper electrode 25 may each have a monolayer structure. Each of the lower electrode 22 and the upper electrode 25 may have a multi-layer structure that includes at least two stacked conductive films.

The lower electrode 22 may extend along the substrate 21 in a first direction. The upper electrode 25 may extend along the substrate 21 along a second direction substantially perpendicular to the first direction. The upper electrode may be formed on the lower electrode 27 or a portion thereof. A gap 27 may be provided between the lower electrode 22 and the upper electrode 25.

The functional molecules 28 may be formed (or disposed) in the gap 27. As illustrated in FIG. 2, a portion of the functional molecules 28 may be attached to (or contacting) the lower electrode 22, the upper electrode 25 and/or the substrate 21 outside of the gap 27.

In example embodiments, the functional molecules 28 may be interposed in the gap 27 between the lower electrode 22 and the upper electrode 25 after the lower electrode 22 and the upper electrode 25 are formed on the substrate 21.

If the functional molecules 28 are formed (or disposed) in the gap 27, the upper electrode 25 may be substantially fixed to the lower electrode 22, increasing the structural stability of the device 200.

Although the functional molecules 28 are formed (or disposed) in the gap 27, a portion of the upper electrode 25 that does not overlap the lower electrode 22 may be attached (or affixed) to the substrate 21. As such, the molecular device 200 may be structurally stable even though the functional molecules 28 are not positioned in the gap 27.

In example embodiments, the number of the functional molecules 28 may depend on the dimension of the gap 27. If the gap 27 has a substantially large width, a larger number of the functional molecules 28 may be used. If the gap 27 has substantially small width, a smaller number of the functional molecules 28 may be used. The number of the functional molecules 28 interposed into the gap 27 may be adjusted by controlling the width of the gap 27.

In example embodiments, if the gap 27 has a substantially large width, a larger number of the molecular layers including the functional molecules 28 may be injected (or disposed) in the gap 27. If the gap 27 has substantially small width, a smaller number of the molecular layers including the functional molecule 28 may be formed in the gap 27. The number of the molecular layers formed in the gap 27 may be adjusted by controlling the width of the gap 27. The width of the gap 27 may have a nano-dimension. The width of the gap 27 may be adjusted to provide a sufficient area for the molecular layer including a single functional molecule 28.

Hereinafter, a method of manufacturing a molecular device according to example embodiments will be described with reference to the accompanying drawings.

FIGS. 4A to 4E are diagrams illustrating cross-sectional views of a method of manufacturing a molecular device illustrated in accordance with example embodiments.

Figure 4A:
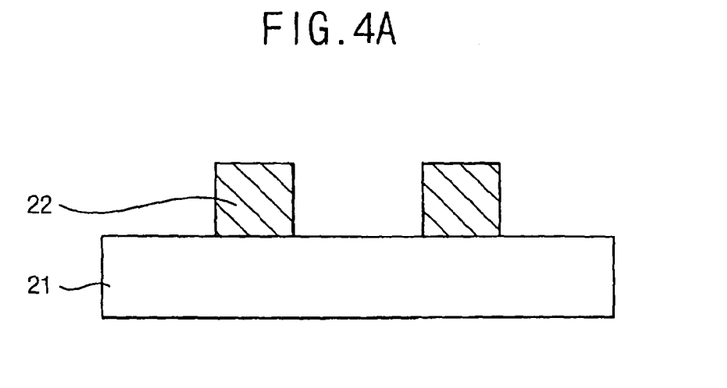
FIGS. 4A to 4E are diagrams illustrating cross-sectional views of a method of manufacturing a molecular device in accordance with example embodiments.

Referring to FIG. 4A, a lower electrode 22 may be formed on a substrate 21. The substrate 21 may be formed of a transparent flexible plastic (e.g., polyethylene terephthalate (PET)). Because PET is inexpensive, costs associated with manufacturing the substrate 21 may decrease.

The lower electrode 22 may include a conductive material (e.g., a metal, a metal compound, doped polysilicon or the like). The lower electrode 22 may be formed of at least one selected from the group consisting of tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, copper, aluminum copper, alloys thereof and mixtures thereof.

The lower electrode 22 may have a monolayer structure. The lower electrode 22 may have a multi-layer structure that includes at least two conductive films stacked on the substrate 21.

The lower electrode 22 may extend along a first direction. Two lower electrodes 22 are illustrated in FIG. 4A. However, exemplary embodiments are not limited thereto. For example, one lower electrode 22 may be formed on the substrate 21. If the number of the lower electrodes 22 is more than two, the lower electrodes 22 are separated from each other in a second direction substantially perpendicular to the first direction.

Figure 4B:
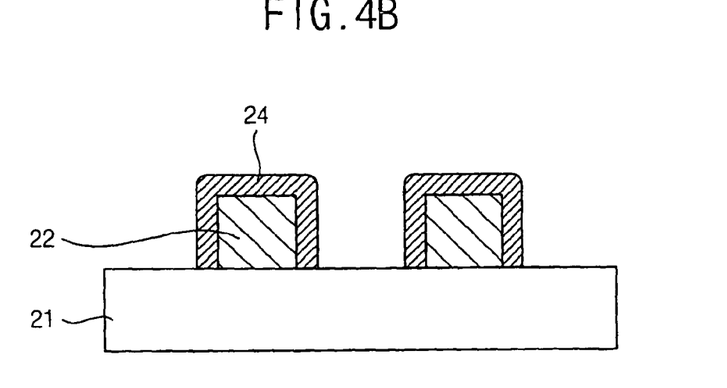

Referring to FIG. 4B, a self-assembled monolayer 24 may be formed on the lower electrode 22. The self-assembled monolayer 24 may enclose (or be formed on exposed sides of) the lower electrode 22. The self-assembled monolayer 24 may include at least one selected from the group consisting of gold (Au), silver (Ag), platinum (Pt), alloys thereof and mixtures thereof.

Figure 4C:
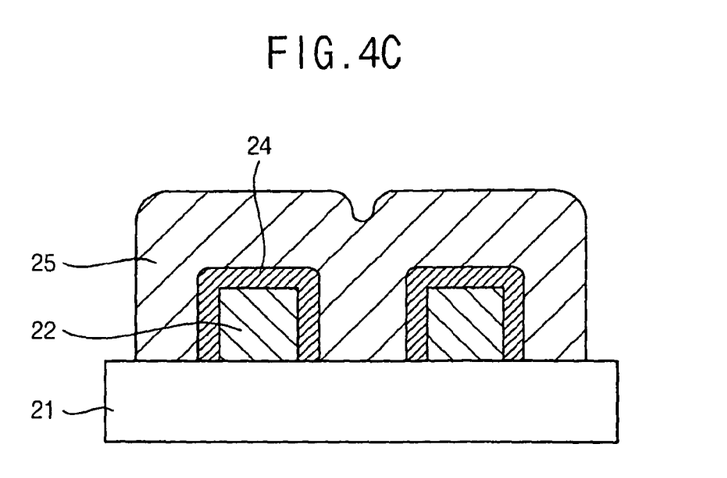

Referring to FIG. 4C, an upper electrode 25 extending in the second direction may be formed on the substrate 21 and the self-assembled monolayer 24. The upper electrode 25 may include a conductive material (e.g., a metal, a metal compound, doped polysilicon or combinations thereof). The upper electrode 25 may include at least one selected from the group consisting of tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, copper, aluminum copper, alloys thereof and mixtures thereof.

The upper electrode 25 may have a monolayer structure. The upper electrode 25 may have a multi-layer structure that includes at least two conductive films stacked on the substrate 21 and the self-assembled monolayer 24. The multi-layer structure may be a titanium film and a gold film successively stacked to form the upper electrode 25.

In example embodiments, after forming at least one conductive layer on the substrate 21 and the self-assembled monolayer 24, the upper electrode 25 may be formed by patterning the conductive layer using a photolithography process. The self-assembled monolayer 24 may be damaged during etching of the conductive layer. The self-assembled monolayer 24 may function as a sacrifice layer which will be removed in a subsequent process. As such, damage to the self-assembled monolayer 24 may not affect characteristics of the molecular device.

Figure 4D:
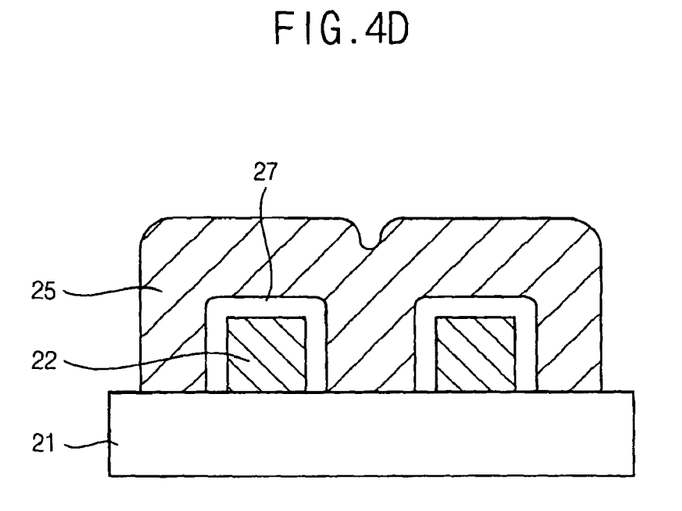

Referring to FIG. 4D, the self-assembled monolayer 24 may be selectively removed after forming the upper electrode 25 in order to form a gap 27 in the area where the self-assembled monolayer 24 was formed. The gap 27 may be formed between the lower electrode 22 and the upper electrode 25.

As described above, because the gap 27 may formed in the area where the self-assembled monolayer 24 was formed, a width of the gap 27 may be adjusted by controlling a width of the self-assembled monolayer 24. The width of the gap 27 may be nano-sized if the self-assembled monolayer 24 has a nano-sized width.

Figure 4E:
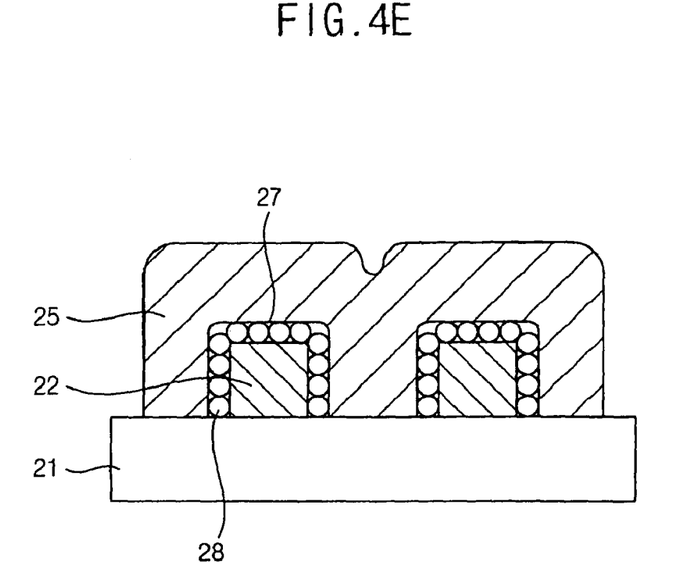

Referring to FIG. 4E, molecules 28 having a predetermined functional group may be interposed into the gap 27. The molecules 28 may be injected into the gap 27 utilizing a capillary phenomenon.

In example embodiments, the substrate 21 on which the gap 27 is formed may be immersed into a solution (not illustrated) wherein the molecules 28 are dissolved. The solution may be evaporated (or reduced) such that the molecules 28 in the solution may be present on a surface of the solution. An interface between an initial solution and an air may be changed into an interface between the molecules 28 and the air such that a capillary force is generated. Due to the capillary force, the functional molecules 28 may be more effectively injected into the gap 27.

According to example embodiments, a contact angle of the solution with respect to the substrate 21 may be adjusted by controlling an immersion angle and an immersion rate while immersing the substrate 21 into the solution. The functional molecules 28 may be more effectively interposed into the gap 27 when the contact angle is properly adjusted.

In example embodiments, surfaces of the functional molecules 28 and/or an inner surface of the gap 27 may be reformed such that the functional molecules 28 are more effectively attach (or bonded) to the inner surface of the gap 27. Functional groups of the functional molecule 28, which have a substantially strong bonding strength, may be attached to portions of the lower electrode 22 and/or the upper electrode 25 such that the functional molecule 28 may be more effectively injected into the gap 27. Functional groups of the functional molecule 28, which have a substantially weak bonding strength, may be attached to portions of the lower electrode 22 and/or the upper electrode 25 where the gap 27 is not positioned such that the functional molecule 28 may be more effectively interposed into the gap 27.

A majority of the functional molecules 28 may be interposed into the gap 27. A portion of the functional molecules 28 may be attached to the lower electrode 22, the upper electrode 25 and/or the substrate 21 outside of the gap 27.

Figure 5:
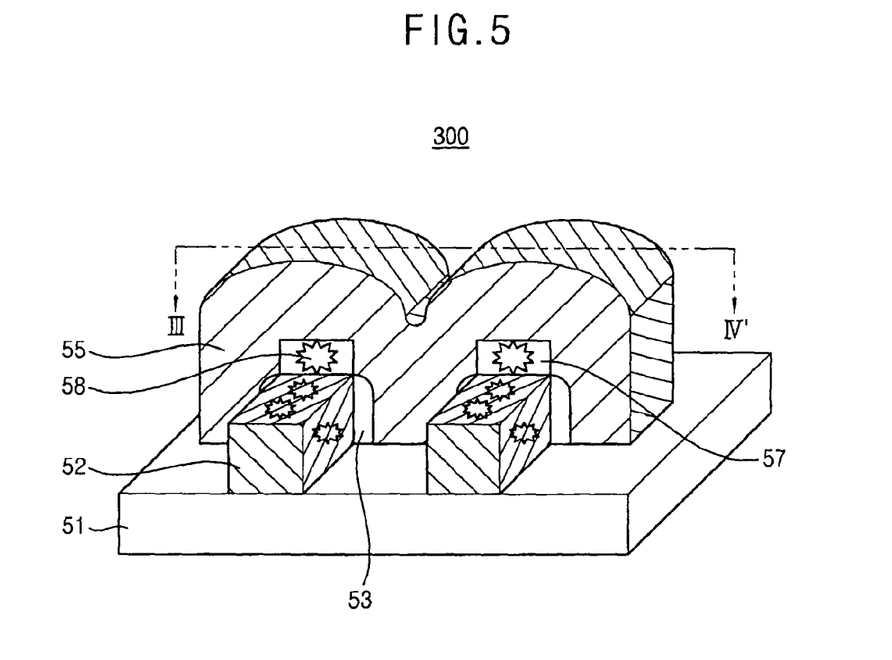
FIG. 5 is a diagram illustrating perspective view of a molecular device 300 in accordance with example embodiments.
Figure 6:
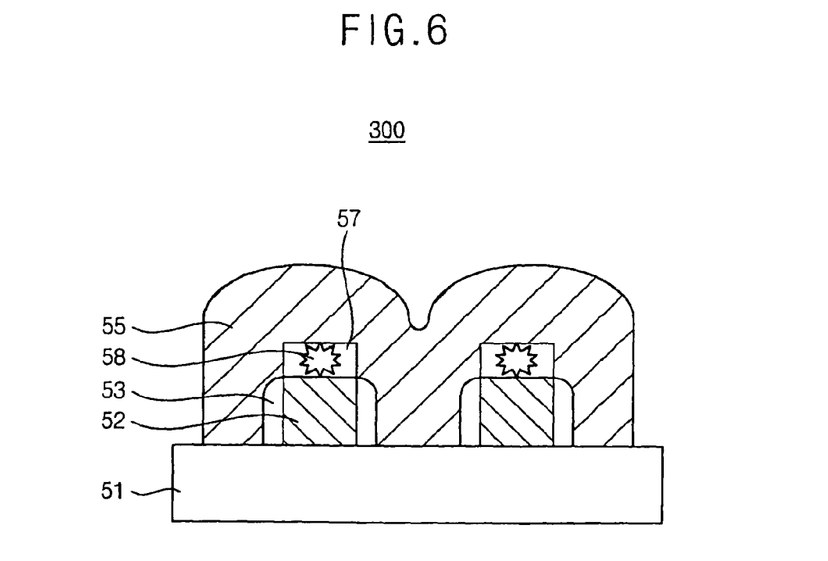
FIG. 6 is a diagram illustrating cross-sectional view of molecular device 300 taken along line III-IV in FIG. 5.

FIG. 5 is a diagram illustrating a perspective view of a molecular device 300 in accordance with example embodiments. FIG. 6 is a diagram illustrating a cross-sectional view of molecular device 300 taken along line III-IV in FIG. 5.

In FIGS. 5 and 6, the molecular device 300 may have a construction substantially the same as that of the molecular device 200 described with reference to FIGS. 2 and 3, except for the inclusion of a spacer 53. Thus, any further descriptions concerning the same or similar elements as those described in FIGS. 2 and 3 will be omitted for the sake of brevity.

Referring to FIGS. 5 and 6, the molecular device 300 includes a substrate 51, a lower electrode 52, an upper electrode 55, a spacer 53, and functional molecules 58 having predetermined functional groups.

The spacer 53 may include an insulation material formed on a side surface of the lower electrode 52 between the lower electrode 52 and the upper electrode 55. The insulation material may include silicon oxide, silicon nitride or the like. A gap 57 may be positioned between an upper surface of the lower electrode 52 between the lower electrode 52 and the upper electrode 55. The functional molecules 58 may be formed (or disposed) in the gap 57.

The spacer 53 may assist in a selective formation of a self-assembled monolayer 54 used to form the gap 57 on the upper surface of the lower electrode 52. The self-assembled monolayer 54 may be selectively formed on the upper surface of the lower electrode 52 due to the spacer 53. The spacer 53 may electrically insulate the upper electrode 55 from the lower electrode 52.

As described above, because the self-assembled monolayer 54 may be selectively formed on the upper surface of the lower electrode 52 due to the spacer 53, the gap 57 formed by removal of the self-assembled monolayer 54 may also be formed on the upper surface of the lower electrode 52.

In example embodiments, widths of the lower electrode 52 and the upper electrode 55 and a thickness of the self-assembled monolayer 54 may be adjusted to control the number of the functional molecules 58 that may be injected into the gap 57. If a size of the gap 57 is substantially small, one functional molecule 58 may be injected into the gap 57.

FIGS. 7A to 7E are diagrams illustrating cross-sectional views of a method of manufacturing a molecular device in accordance with example embodiments.

In FIGS. 7A to 7E, the molecular device has a construction substantially the same as or substantially similar to that of the molecular device 300 described with reference to FIGS. 5 and 6. Thus, any further descriptions concerning the same or similar elements as those described in FIGS. 5 and 6 will be omitted for the sake of brevity.

Figure 7A:
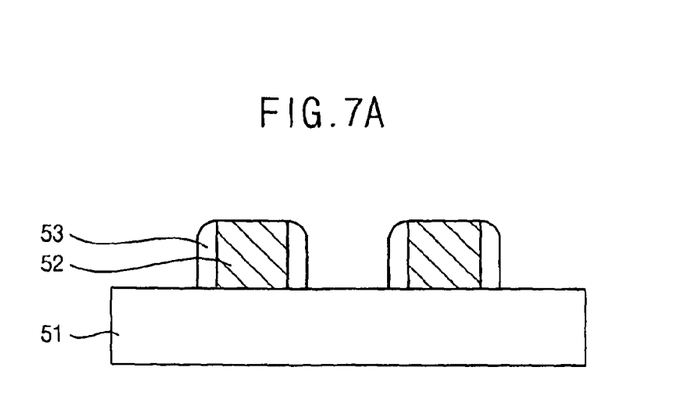
FIGS. 7A to 7E are diagrams illustrating cross-sectional views of a method of manufacturing a molecular device in accordance with example embodiments.

Referring to FIG. 7A, at least one lower electrode 52 may be formed on a substrate 51 by processes substantially the same as those described in FIG. 4A. The lower electrode 52 may extend on the substrate 51 along a first direction. A spacer 53 may be formed on a side surface of the lower electrode 52.

In example embodiments, the spacer 52 may be formed by a lift-off process after an insulation material (e.g., silicon oxide or silicon nitride) is deposited on a photoresist pattern by a physical vapor deposition (PVD) process or similar process. The photoresist pattern may be used to pattern a conductive layer formed on the substrate 51 in order to form the lower electrode 52.

In example embodiments, an insulation material (e.g., silicon oxide, silicon nitride or the like) may be deposited on the substrate 51 to form an insulation layer covering the lower electrode 52. An anisotropic etching process (e.g., an etch-back process) may be performed on the insulation layer to form the spacer 53 on the side surface of the lower electrode 52.

Figure 7B:
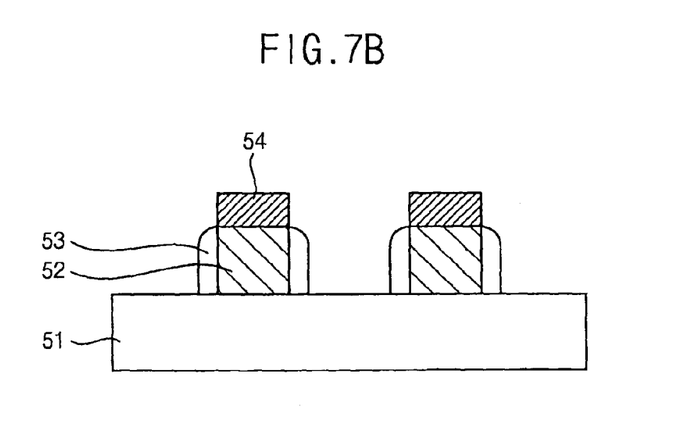

Referring to FIG. 7B, a self-assembled monolayer 54 may be formed on an upper surface of the lower electrode 52. The self-assembled monolayer 54 may be selectively formed on the upper surface of the lower electrode 52 due to the spacer 53.

Figure 7C:
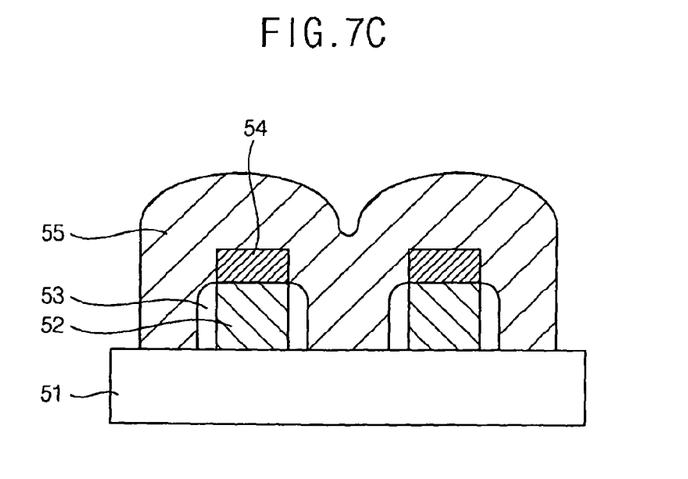

Referring to FIG. 7C, an upper electrode 55 may be formed on the substrate 51 to cover the spacer 53 and the self-assembled monolayer 54. The upper electrode 55 may extend in a second direction substantially perpendicular to the first direction of the lower electrode 52.

Figure 7D:
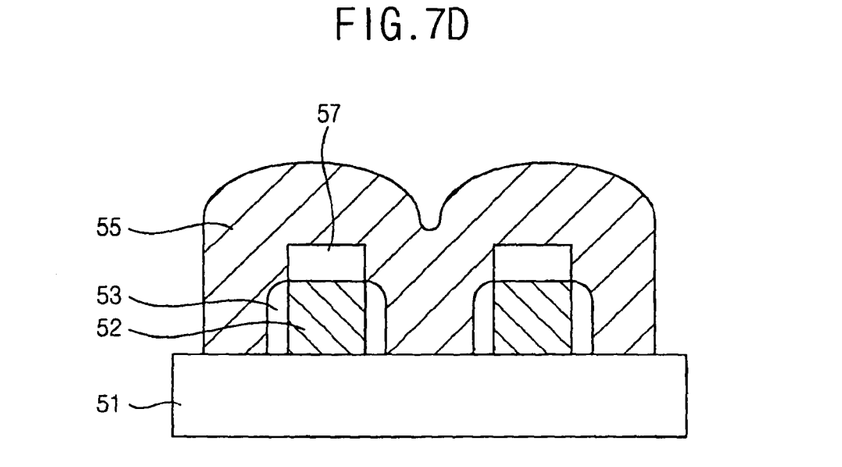

Referring to FIG. 7D, the self-assembled monolayer 54 may be selectively removed from the lower electrode 52. A gap 57 may be provided (or formed) between the upper surface of the lower electrode 52 and the upper electrode 55.

The gap 57 provided by a removal of the self-assembled monolayer 54 may be positioned on the upper surface of the lower electrode 52 due to the spacer 53 and the formation of the self-assembled monolayer 54 on the upper surface of the lower electrode 52.

Figure 7E:
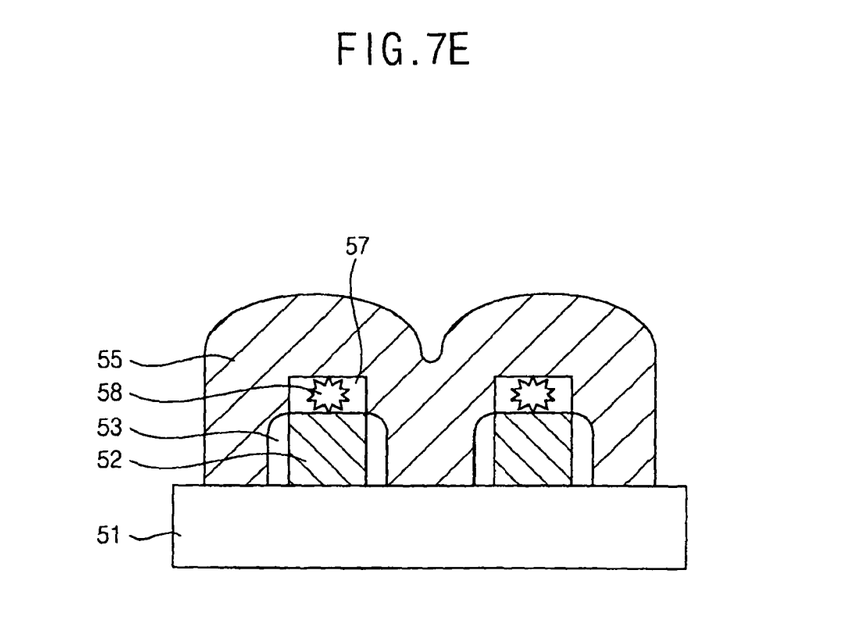

Referring to FIG. 7E, functional molecules 58 having predetermined functional groups may be injected into the gap 57. Widths of the lower electrode 52 and upper electrode 55 and a thickness of the self-assembled monolayer 54 may adjusted such that a desired number of the functional molecules 58 may be interposed into the gap 57. If a size of the gap 57 is substantially small, a single functional molecule 58 may be in the gap 57.

Figure 8:
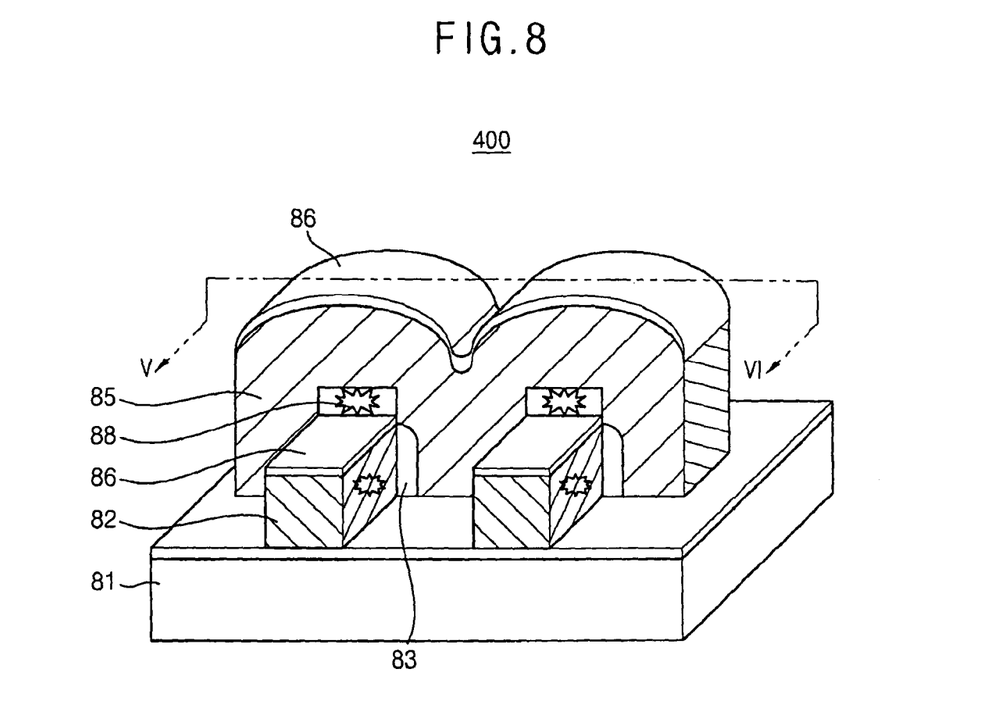
FIG. 8 is a diagram illustrating a perspective view of a molecular device 400 in accordance with example embodiments.
Figure 9:
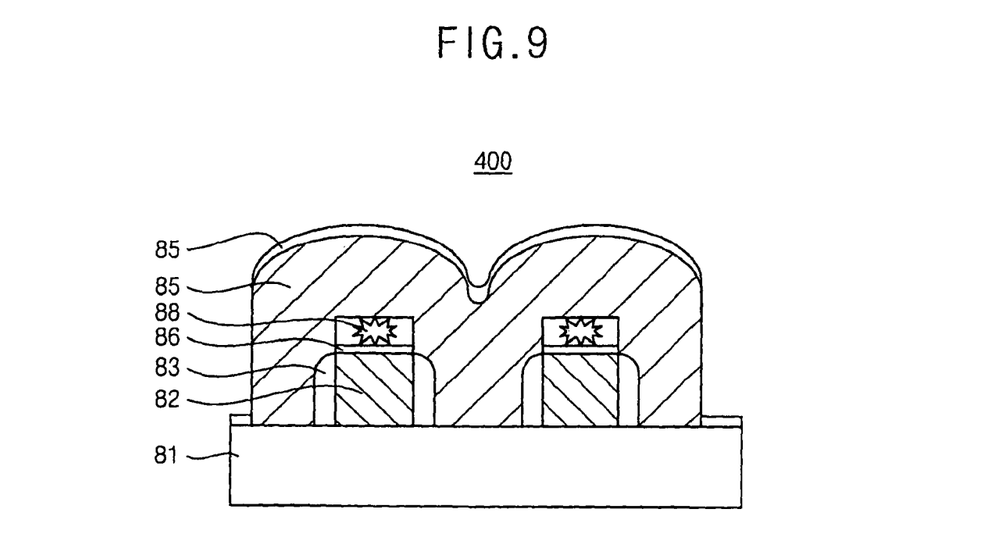
FIG. 9 is a diagram illustrating a cross-sectional view of molecular device 400 taken along line V-VI in FIG. 8.

FIG. 8 is a diagram illustrating a perspective view of a molecular device 400 in accordance with example embodiments. FIG. 9 is a diagram illustrating a cross-sectional view of molecular device 400 taken along line V-VI in FIG. 8.

In FIGS. 8 and 9, the molecular device may have a construction substantially the same as that of molecular device 300 described with reference to FIGS. 5 and 6 except for the inclusion of an insulation layer 86. Thus, any further explanation concerning the same or similar elements as those described in FIGS. 5 and 6 will be omitted for the sake of brevity.

Referring to FIGS. 8 and 9, the molecular device 400 includes a substrate 81, a lower electrode 82, an upper electrode 85, a spacer 83, the insulation layer 86, and functional molecules 88 having predetermined functional groups.

The insulation layer 86 may be formed on upper surfaces of the lower electrode 82 and the upper electrode 85. The insulation layer 86 may include an insulating material (e.g., silicon oxide, silicon nitride or the like).

The insulation layer 86 positioned on the lower and the upper electrodes 82 and 85 may not be formed in a gap 87 provided between the lower electrode 82 and the upper electrode 85.

The thickness of the insulation layer 86 may be substantially smaller than the width of the gap 87 in order that the functional molecules 88 may be injected into the gap 87.

FIGS. 10A to 10F are diagrams illustrating cross-sectional views of a method of manufacturing a molecular device in accordance with example embodiments.

In FIGS. 10A to 10F, the molecular device may have a construction substantially the same as that of molecular device 400 described with reference to FIGS. 8 and 9. Thus, any further descriptions concerning the same or similar elements as those described in FIGS. 8 and 9 will be omitted for the sake of brevity.

Figure 10A:
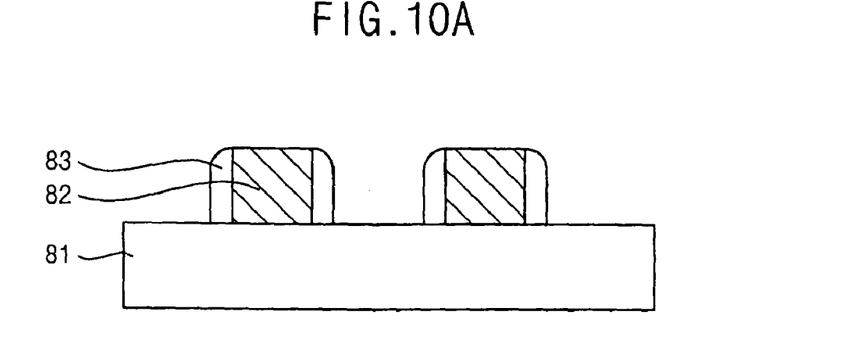
FIGS. 10A to 10F are diagrams illustrating cross-sectional views of a method of manufacturing a molecular device in accordance with example embodiments.

Referring to FIG. 10A, at least one lower electrode 82 may be formed on a substrate 81 by processes substantially the same as those described with reference to FIG. 4A. The lower electrode 82 may extend along a first direction. A spacer 83 may be formed on a side surface of the lower electrode 82.

In example embodiments, an insulation material (e.g., silicon oxide or silicon nitride) may be deposited by a PVD process on a photoresist pattern used to pattern a conductive layer on the substrate 81 in order to form the lower electrode 82. The insulation material may be etched by a lift-off process to form the spacer 83 on the side of the lower electrode 82.

In example embodiments, an insulation material (e.g., silicon oxide or silicon nitride) may be deposited on the substrate 81 to form an insulation layer covering the lower electrode 82. An anisotropic etching process (e.g., an etch-back process) may be performed on the insulation layer in order to form the spacer 83 on the side surface of the lower electrode 82.

Figure 10B:
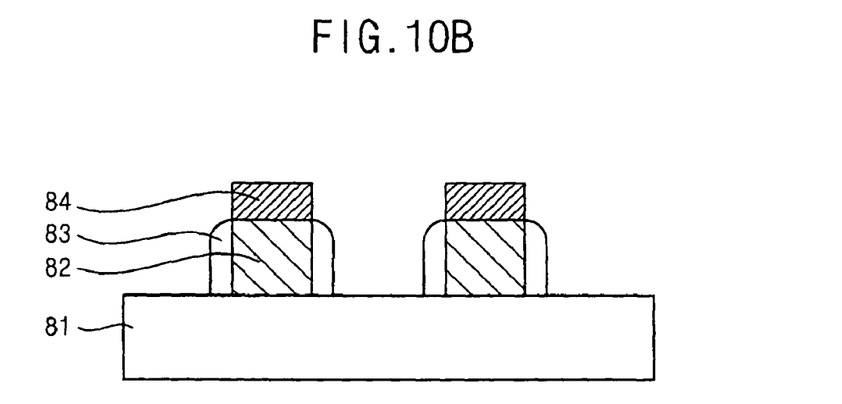

Referring to FIG. 10B, a self-assembled monolayer 84 may be formed on an upper surface of the lower electrode 82. The self-assembled monolayer 84 may be selectively formed on the upper surface of the lower electrode 82 due to the spacer 83.

Figure 10C:
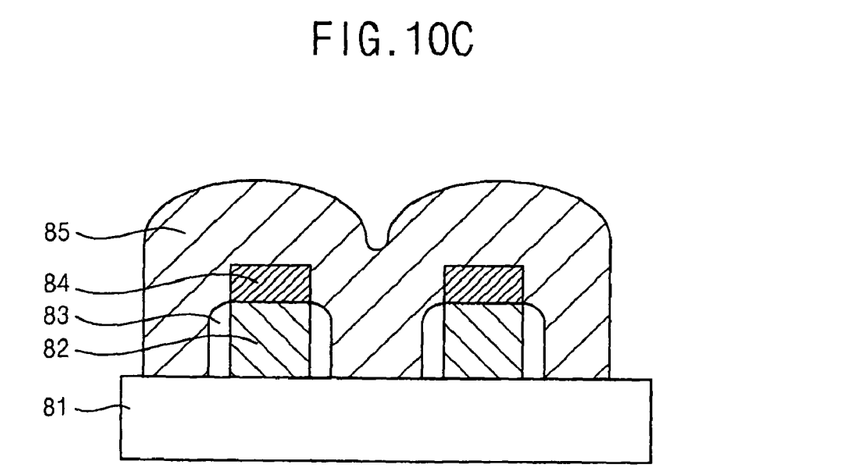

Referring to FIG. 10C, an upper electrode 85 may be formed on the substrate 81 to cover the spacer 83 and the self-assembled monolayer 84. The upper electrode 85 may extend along a second direction substantially perpendicular to the first direction of the lower electrode 82.

Figure 10D:
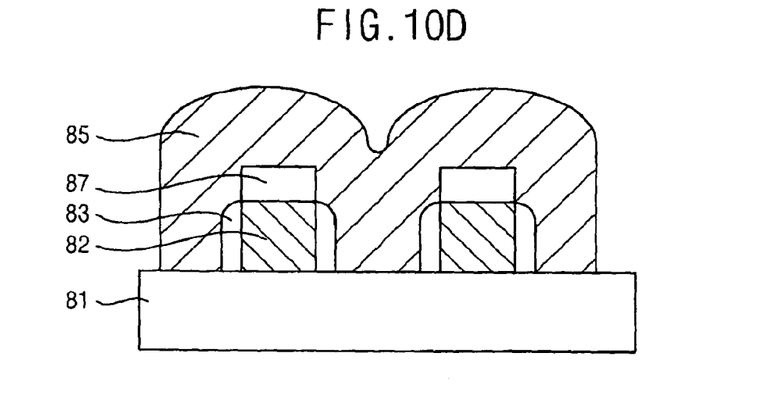

Referring to FIG. 10D, the self-assembled monolayer 84 may be selectively removed from the lower electrode 82. A gap 87 may be formed between the upper surface of the lower electrode 82 and the upper electrode 85.

The gap 87 provided by removing the self-assembled monolayer 84 may be formed on the upper surface of the lower electrode 82 due to the spacer 83 and the self-assembled monolayer 84 selectively formed on the upper surface of the lower electrode 82.

Figure 10E:
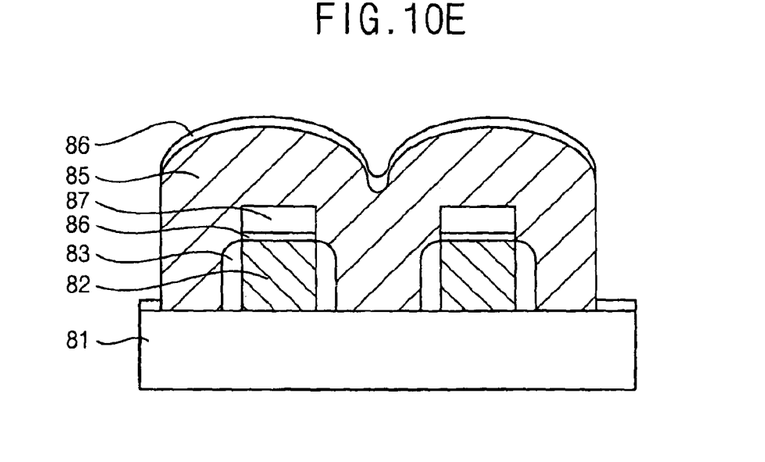

Referring to FIG. 10E, an insulation layer 86 may be formed on upper surfaces of the lower electrode 82 and the upper electrode 85. The insulation layer 86 may include an insulating material (e.g., silicon oxide, silicon nitride or the like). The insulation layer 86 may be formed by a physical vapor deposition (PVD) process, a chemical vapor deposition (CVD) process or a similar process.

The insulation layer 86 positioned on the upper surfaces of the lower electrode 82 and the upper electrode 85 may not be formed in a gap 87 provided between the lower electrode 82 and the upper electrode 85.

The thickness of the insulation layer 86 may be substantially smaller than the width of the gap 87 such that the functional molecules 88 may be injected into the gap 87.

Figure 10F:
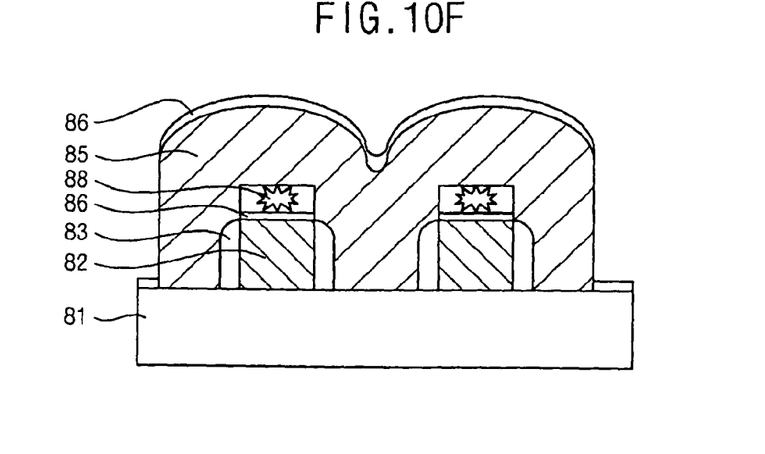

Referring to FIG. 10F, the functional molecules 88 having predetermined functional groups may be interposed in the gap 87 by a capillary phenomenon or a similar bonding method. Widths of the lower electrode 82 and the upper electrode 85 and a thickness of the self-assembled monolayer 84 may be adjusted to control the number of the functional molecules 88 injected into the gap 87. If a size of the gap 87 is small, a single functional molecule 88 may be injected into the gap 87.

The functional molecules 88 having the predetermined functional groups may be formed (or attached) outside of the gap 87 as well as inside the gap 87. Electrical characteristics of the molecular device may not be affected by the inclusion of a plurality of cells because the insulation layer 86 may more effectively separate the cells from each other. The insulation layer 86 may prevent (or reduce) a cross-talk phenomenon of the molecular device.

According to example embodiments, a width of a gap where a functional molecule is injected may be determined in accordance with a thickness of a self-assembled monolayer. The width of the gap may be more accurately controlled by adjusting the thickness of the self-assembled monolayer while forming the self-assembled monolayer. A plurality of gaps having uniform widths may be simultaneously formed by removing the self-assembled monolayer.

The number of functional molecules may be controlled by adjusting the widths of the gap. The molecular device may include cells each having single functional molecules by adjusting the width of each gap. Accordingly, uniformity of the molecular device may increase despite the inclusion of a plurality of cells.

Because the molecular layer is formed after the upper electrode, deterioration of the molecular layer may decrease in comparison with the conventional molecular device having an upper electrode formed after a molecular layer.

According to example embodiments, an additional etching process for separating cells from each other may not be necessary to manufacture the molecular device. The occurrence of a cross-talk phenomenon, which is caused by a connection of molecules in cells when a molecular layer is formed by a self-assembled method or a Langmuir-Blodgett method, may be prevented (or reduced).

According to example embodiments, a plastic substrate may be used to impart flexibility to a molecular device such that the molecular device may be used a variety of electronic devices (e.g., a smart card, a high frequency reader device or the like).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A molecular device, comprising:
   a lower electrode on a substrate;

an upper electrode on the substrate, the upper electrode overlapping the lower electrode such that a gap is formed between the lower electrode and the upper electrode;

a spacer between the upper electrode and a side surface of the lower electrode; and a functional molecule including a functional group interposed in the gap.

2. The molecular device of claim 1, wherein the gap is formed by removing a self-assembled monolayer positioned between the lower electrode and the upper electrode.

3. The molecular device of claim 1, wherein the lower electrode extends along a first direction and the upper electrode extends in a second direction substantially perpendicular to the first direction.

4. The molecular device of claim 1, wherein the lower electrode includes at least one selected from the group consisting of gold (Au), silver (Ag), platinum (Pt), alloys thereof and combinations thereof.

5. The molecular device of claim 1, wherein a width of the gap is substantially the same as a size of the functional molecule, and the functional molecule interposed in the gap has a monolayer structure.

6. The molecular device of claim 1, wherein the substrate comprises a transparent and flexible plastic.

7. The molecular device of claim 1, wherein the gap is formed by removing a self-assembled monolayer selectively formed between the upper electrode and an upper surface of the lower electrode.

8. The molecular device of claim 7, further comprising an insulation layer on an upper surface of the upper electrode and the upper surface of the lower electrode.

9. The molecular device of claim 8, wherein a thickness of the insulation layer is substantially smaller than a width of the gap.

10. The molecular device of claim 9, wherein the insulation layer is positioned outside of the gap.

* * * * *